(12) United States Patent
Song et al.

(10) Patent No.: US 6,259,321 B1
(45) Date of Patent: Jul. 10, 2001

(54) CMOS VARIABLE GAIN AMPLIFIER AND CONTROL METHOD THEREFOR

(75) Inventors: Won Chul Song; Chang Jun Oh; Hee Bum Jung, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/490,732

(22) Filed: Jan. 25, 2000

(30) Foreign Application Priority Data

Nov. 23, 1999 (KR) ................................................ 99-52110

(51) Int. Cl.[7] ........................................................ H03F 3/45
(52) U.S. Cl. ............................................. 330/254; 330/310
(58) Field of Search ................................... 330/253, 254, 330/261, 264, 310, 311

(56) References Cited

U.S. PATENT DOCUMENTS

| | | | |
|---|---|---|---|
| 4,459,555 | 7/1984 | Jett, Jr. ................................. | 330/253 |
| 4,816,772 | * 3/1989 | Klotz .................................... | 330/254 |
| 5,043,675 | * 8/1991 | Gilbert ................................. | 330/258 |
| 5,793,239 | * 8/1998 | Kovacs et al. ....................... | 327/262 |
| 5,880,631 | 3/1999 | Sahota .................................. | 330/51 |
| 5,880,637 | * 3/1999 | Gonzalez ............................. | 330/253 |
| 6,011,437 | * 1/2000 | Sutardja et al. ...................... | 330/254 |
| 6,127,890 | * 10/2000 | Shimomura et al. ................ | 330/254 |

OTHER PUBLICATIONS

Piazza et al., "A 2mA/3V 71MHz IF Amplifier in 0.4um CMOS Programmable Over 80dB Range," IEEE International Solid–State Circuits Conference (ISSCC—97), San Francisco, Feb. 6–8, 1997.

* cited by examiner

Primary Examiner—Robert Pascal
Assistant Examiner—Henry Choe
(74) Attorney, Agent, or Firm—E. Russell Tarleton; Seed IP Law Group PLLC

(57) ABSTRACT

A CMOS high frequency variable gain amplifier with maximum high frequency operation and wide variable gain characteristics that is formed from an amplifier having a plurality of variable gain amplifier cells connected in series for continuously enabling wide gain variation; and a control voltage generator for generating and outputting the control voltage of the variable gain amplifier cells. By using both the saturation region and the linear region of input differential transistors constituting the variable gain amplifier cells in order to obtain wide gain variation characteristics, it is possible for the variable gain amplifier to operate in the saturation region when the input signal is small to obtain a high gain and to operate in the linear region when the input signal is large to obtain minimum distortion and a low gain. Also, it is possible for the gain to have the characteristics in the form of an exponential function to the gain control voltage.

7 Claims, 5 Drawing Sheets

CMOS VARIABLE GAIN AMPLIFIER AND CONTROL METHOD THEREFOR

TECHNICAL FIELD

The present invention relates to a high frequency variable gain amplifier, and more specifically, to a CMOS variable gain amplifier in which maximum high frequency is achieved and the variable gain characteristic is wide as well, and a control method therefor.

BACKGROUND OF THE INVENTION

Recently, with the rapid development of the mobile communication service, radio portable devices are becoming widespread, and correspondingly low-priced and compact devices have been actively researched.

Radio signals have varying magnitude at any given time due to the distance from the base station and various kinds of obstacles. Therefore, a variable gain amplifier is required to correct this.

Figure 1:
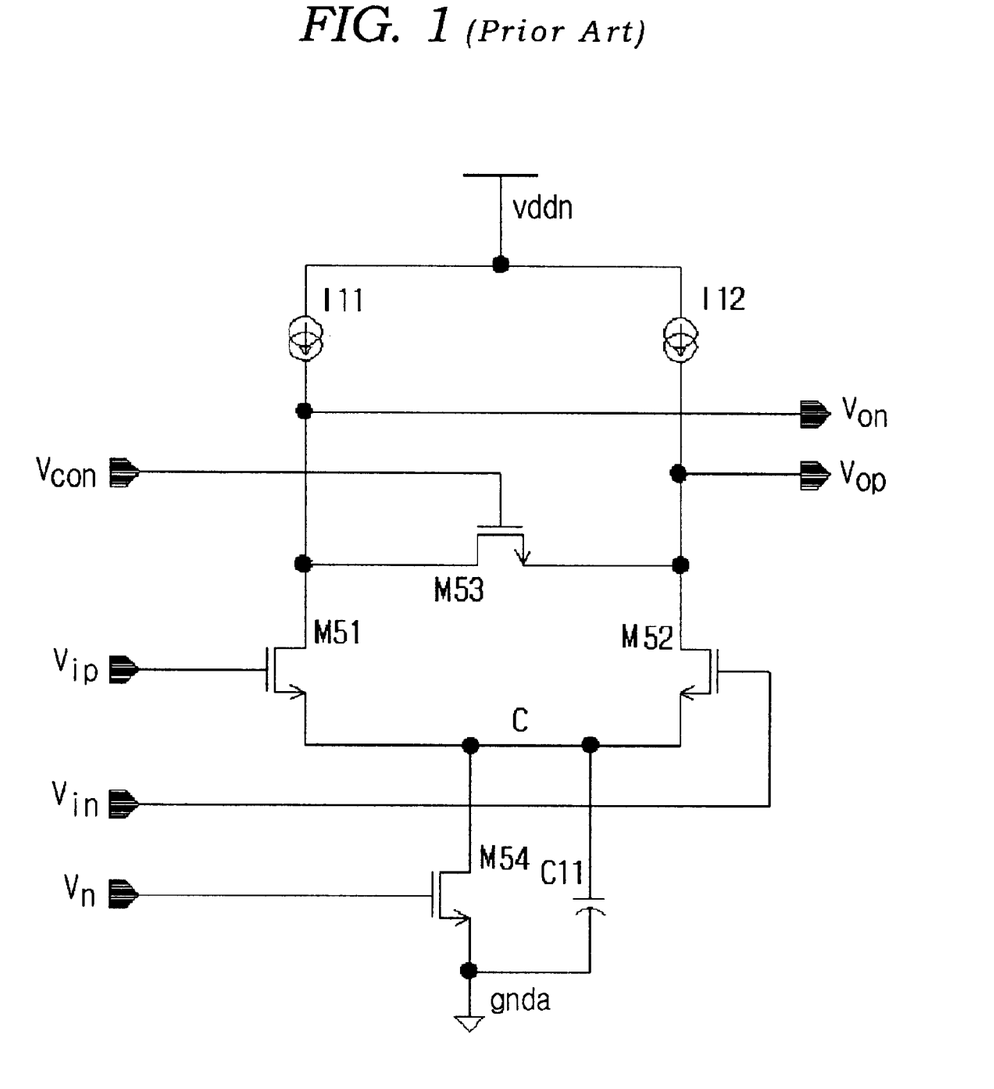
FIG. 1 is a circuit diagram of a typical variable gain amplifier of the prior art.
Figure 2:
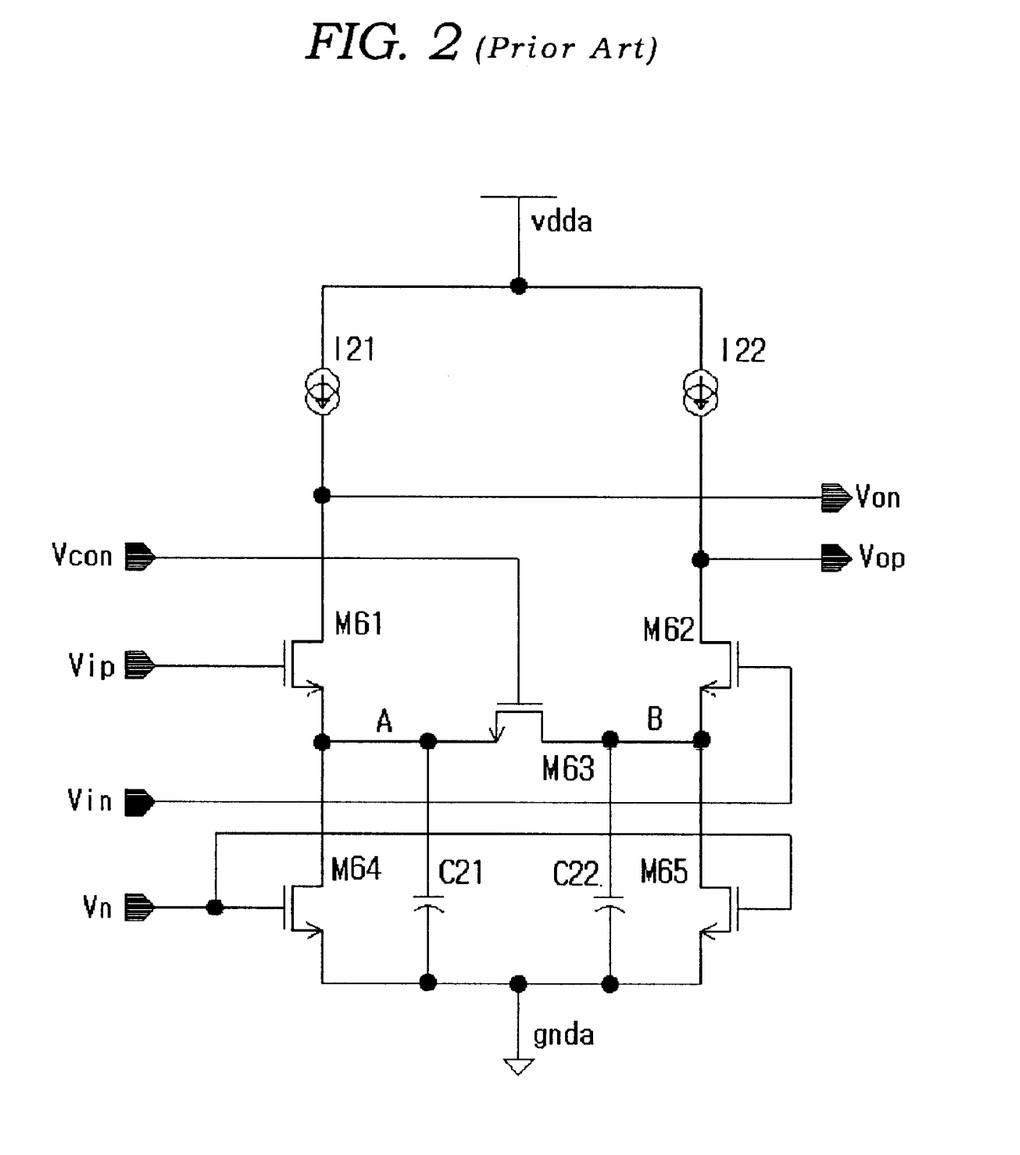
FIG. 2 is a circuit diagram of another typical variable gain amplifier of the prior art.

There are several variable gain amplifiers, but two typical variable gain amplifiers are shown in FIGS. 1 and 2, respectively.

When the variable gain amplifier shown in FIG. 1 is applied with input voltage through Vip and Vin, the input voltage is converted into the current by transistors M51 and M52, and this current is applied to the load consisting of the current sources I11, I12, and transistor M53, making the output voltage appear at Von and Vop. At this time, if the control voltage Vcon is applied to the gate of the transistor M53, the resistance of the drain-source of the transistor M53 is caused to vary according the control voltage Vcon. That is, the gain can be varied with the variation of the output resistance.

The advantage of the variable gain amplifier shown in FIG. 1 is that the variable gain characteristic at high frequency is excellent, this is because the source connection point C of differential input transistors M51, M52 is virtual ground, and parasitic capacitance C11 of any magnitude generated in the source connection C has non influence on the variable operation.

However, the variable gain amplifier of FIG. 1 has the disadvantage in that case of more than hundreds of mV voltage being applied to the input, a considerable distortion is generated while the input transistor M51 or M52 departs from the conductive state. That is, the variable gain amplifier described above is not able to be used for large input.

In FIG. 2 another type of a variable gain amplifier is shown with the advantage in view of the operational voltage range. The structure of FIG. 2 is similar to that of FIG. 1 except that the transistor M63, which plays a role of active resistor varying with the control voltage Vcon, is connected between the sources of the transistors M61 and M62 forming a pair of inputs.

The variable gain amplifier shown in FIG. 2 operates to raise the control voltage Von and reduce the resistance of transistor M63 when the input voltage is small, thereby to increase the gain. At this time, the distortion is also small since the input is small. Conversely, the variable gain amplifier of FIG. 2 operates to decrease the control voltage Vcon, thereby to increase the source resistance between the input transistors M61, M62 when the input voltage is large. Then, since the input is provided with the negative-feedback due to the large resistance, the gain is reduced and the output is reduced. At this time, the negative-feedback to the large input is caused to reduce the distortion relatively.

However, the variable gain amplifier of FIG. 2 has a problem of gain reduction characteristics at high operating frequency.

Specifically, there is little effect from parasitic elements at low frequency, but a greater effect is generated at high frequency.

In FIG. 2, parasitic capacitive elements C21, C22 exist between the drains and sources of the transistors M63, M64, and M65 and the ground. If the control voltage is reduced due to the large input voltage at the high frequency and the drain-source resistance of the transistor M63 is increased, the source currents of the transistors M61 and M62 gradually flow through the parasitic capacitance elements C21, C22. This has an effect of reducing the impedance in view of the input transistor in spite of no variation of Vcon.

Due to this, the desired gain reduction cannot be obtained. Namely, FIG. 2 shows the variable gain amplifier in which excellent characteristics can be obtained at a low frequency while the desired broad gain reduction characteristics cannot be obtained only at a high frequency. Therefore, the operating frequency region becomes narrowed.

SUMMARY OF THE INVENTION

The disclosed embodiments of the present invention provide a CMOS variable gain amplifier that has a broad input range and desirable high-frequency operational characteristics by overcoming the restrictive characteristics encountered in the magnitude of input and the operating frequency in the conventional CMOS variable gain amplifiers described above, and a control method is provided therefor.

The disclosed embodiments of the present invention provides a new high-frequency variable gain amplifier that operates within possible maximum high frequency range and has small distortion in spite of wide-range input voltage by using CMOS elements in which the operational characteristics are lower than bipolar elements but the manufacturing cost is low and integration with a digital circuit is easy, the output gain of the amplifier being in the form of an exponential function according to a control input voltage.

A CMOS variable gain amplifier of the present invention includes an amplifier and a control voltage generator.

The amplifier has a plurality of variable gain amplifier cells with substantially the same gains connected in series to continuously have a broad gain variation. The control voltage generator generates a control voltage of the variable gain amplifier cells to vary a gain of the amplifier according to an external control voltage.

Preferably, the variable gain amplifier cells of the amplifier include an input differential amplifier, a bias current source, an operating point controller and load resistors. The input differential amplifier includes the first and the second input differential transistors having voltage inputs. The bias current source includes a first transistor of which a drain is commonly connected to sources of the first and the second input differential transistors for supplying a bias current. The operating point controller includes the second and the third transistors, of which each source is connected to the drains of the first and the second input differential transistors, and a common gate is connected to the control voltage terminal for controlling the operating point to be in a linear region and a saturation region of the first and the second input differential transistors. The load resistors are respectively connected to drains of the second and the third transistors for loading output voltages at a connection point.

Preferably, the control voltage generator includes an exponential function voltage generator, a variable gain amplifier cell, a current source, and an operational amplifier. The exponential function voltage generator generates a voltage in the form of an exponential function according to a control input voltage. The variable gain amplifier cell amplifies an output voltage of the exponential function voltage generator. The current source is connected to an output node of the variable gain amplifier cell to provide a current in the direction of offsetting an output voltage of the variable gain amplifier cell. The operational amplifier receives the offset voltage from the current source and generates the control voltage for the variable gain amplifier cells.

Preferably, the exponential function voltage generator includes a control voltage converter, an exponential function voltage generator, and a base voltage generator. The control voltage converter converts the external control voltage to a magnitude suitable for an internal signal processing. The exponential function voltage generator generates a exponential function voltage with an emitter of an internal bipolar element being supplied with an output of the control voltage converter. The base voltage generator determines a base voltage of the bipolar element of the exponential function voltage generator.

Preferably, the control voltage converter comprises an operational amplifier in which the magnitude of the output voltage is regulated by resistors.

Preferably, the exponential function voltage generator includes the following elements: An operational amplifier, a fourth transistor, and a fifth transistor form a voltage-follower to an output voltage of the control voltage converter. A bipolar transistor of which an emitter is applied with source voltages of the fourth and the fifth transistors and a base is applied with a voltage from the base voltage generator generates an exponential function current to the emitter thereof. A sixth transistor and a seventh transistor form a current mirror to a drain current of the fourth transistor. Resistors convert a sourcing current flowing through a drain of the sixth transistor and a sinking current flowing through a drain of the fifth transistor into a voltage in the form of exponential function, respectively.

Preferably, the base voltage generator includes the following elements: An operational amplifier and an eighth transistor form a voltage-follower to an external reference voltage. A bipolar transistor of which an emitter is applied with a source voltage of the eighth transistor generates an emitter current of the bipolar transistor of the exponential function voltage generator. A ninth transistor receives a certain drain current from the current source. A tenth transistor coupled to the ninth transistor forms a current mirror. An eleventh transistor, a twelfth transistor, a thirteenth transistor, a fourteenth transistor, and a fifteenth transistor coupled together form an operational amplifier having a gate terminal and a source terminal of the eleventh transistor as two input terminals and regulate the base voltage of the bipolar transistor according to a drain current variation of the tenth transistor.

In addition, a method for controlling a CMOS variable gain amplifier having a plurality of variable gain amplifier cells of the present invention is provided.

The operating points of the CMOS elements of the variable gain amplifier cells are controlled to be in a linear region or a saturation region by a control voltage that is externally regulated according to an input voltage to continuously vary the operating points.

DETAILED DESCRIPTION OF THE INVENTION

Hereinafter, the representative embodiments of the present invention will be described by referring to the attached drawings.

A method of controlling a CMOS variable gain amplifier according to the present invention enables the operating points of CMOS elements of the variable gain amplifier cells to be controlled in the linear region or saturation region by a control voltage that is externally regulated, so that the gain can be continuously varied.

Figure 3:
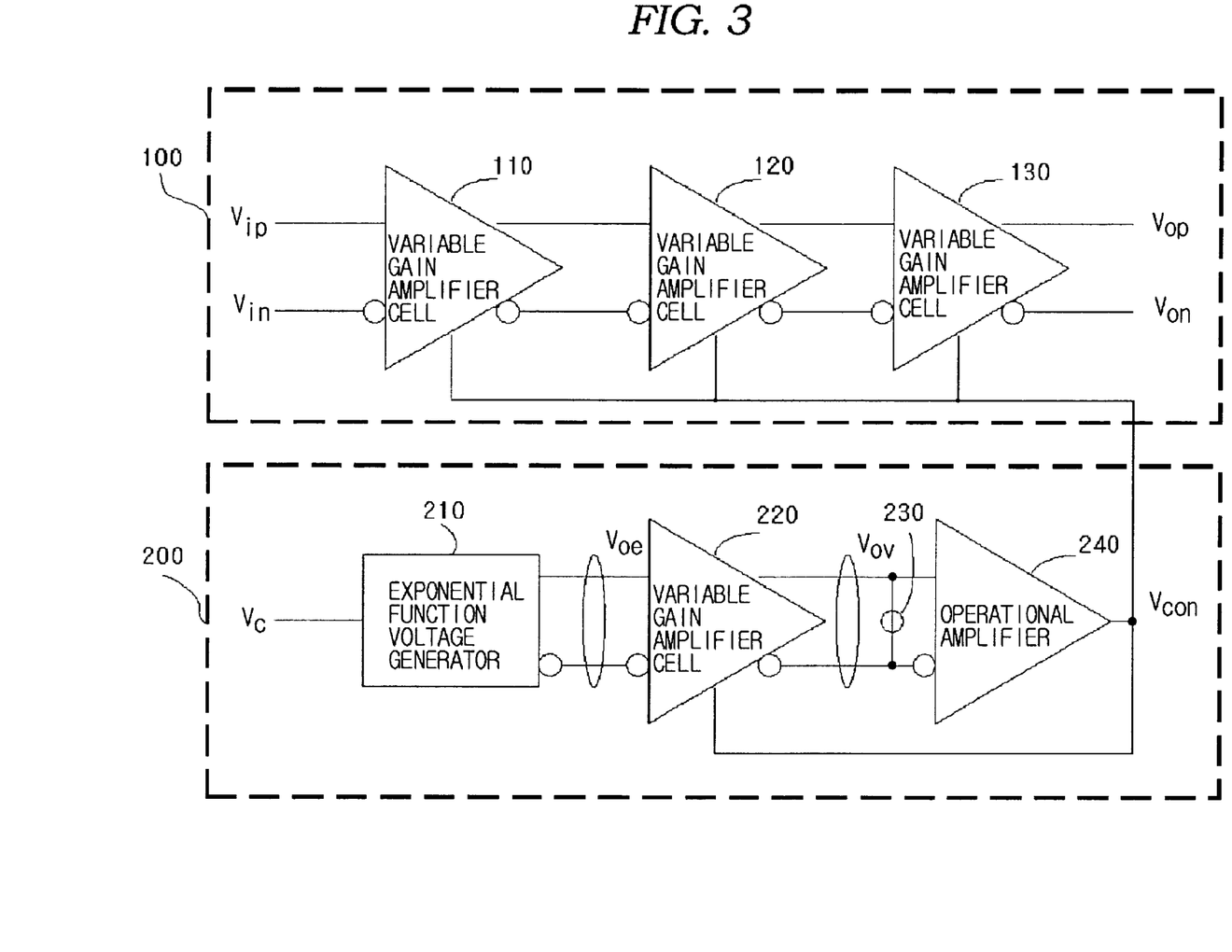
FIG. 3 is a circuit diagram of a CMOS variable gain amplifier according to the present invention.

FIG. 3 is a circuit diagram of an entire CMOS variable gain amplifier according to the present invention to embody the method of controlling a variable gain amplifier.

As shown in the FIG. 3, the variable gain amplifier comprises an amplifier 100 for enabling broad gain variation and a control voltage generator 200 for generating a voltage to control the amplifier 100.

The amplifier 100 comprises a plurality (for example, 3) of variable gain amplifier cells 110–130 connected in series.

The control voltage generator 200 comprises an exponential function voltage generator 210 for generating a voltage in the form of exponential function according to a control input voltage, a variable gain amplifier cell 220 for amplifying the output voltage of the exponential function voltage generator 210, a current source 230 which is connected to the output node of the variable gain amplifier cell 220 and provides a current in the direction of offsetting the output voltage, and an operational amplifier 240 for receiving the voltage offset by the current source 230 and for generating a control voltage of the variable gain amplifier cells 110–130, 220.

First, the variable gain amplifier cells that constitute the variable gain amplifier according to the present invention will be described in detail by referring to FIG. 4.

Figure 4:
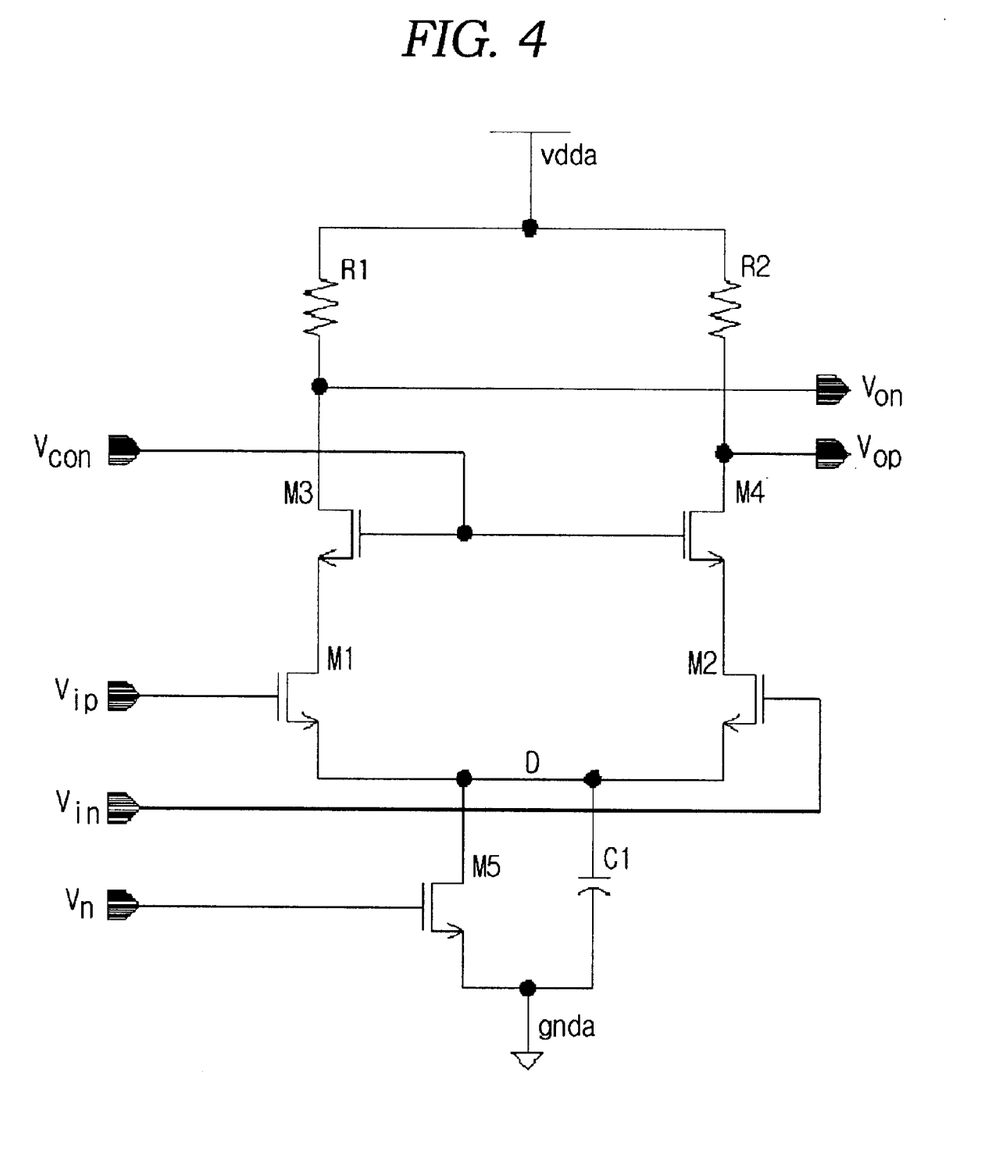
FIG. 4 is a detailed circuit diagram for variable gain amplifier cells used in the present invention.

FIG. 4 is a detailed circuit diagram of the variable gain amplifier cell used in the present invention.

As shown in FIG. 4, the variable gain amplifier cells of the amplifier 100 comprise an input differential amplifier consisting of two input differential transistors M1, M2 to which the input voltage is applied; a bias current regulator including a transistor M5 of which the drain is commonly connected to the sources of the input differential transistors M1, M2 for regulating a bias current; an operating point controller consisting of transistors M3, M4 of which each source is connected to the drains of the input differential transistors M1, M2 and a common gate is connected to a control voltage Vcon terminal for controlling the operating points to be in the linear region and the saturation region of the input differential transistors; and load resistors R1, R2 being respectively connected to the drains of the transistors M3, M4 for loading the output voltages Von, Vop at the connection points.

Similarly to FIG. 1, the parasitic capacitance C1, which is connected to a node D, does not affect the frequency characteristics according to the gain variation because the node D is a virtual ground.

Also, the control transistors M3, M4 play a role of masking the Miller effect and of making the frequency characteristics favorable by the sources of the control transistors M3, M4 being series-connected to the drains of the input differential transistors M1, M2 as well as a role of controlling the operating points.

By varying the drain-source voltage of the two transistors M1, M2 of the input differential amplifier according to the control voltage Vcon, the variable gain amplifier cell operates the operating point to shift between the linear region and the saturation region to control the gain.

Bias voltages of external input signal to be amplified, Vip, Vin, are applied as the bias voltages of the input differential transistors M1, M2, and the common mode voltages of the output of the variable amplifier cell, Von, Vop, become the bias voltage of the variable gain amplifier cell of the next stage. Therefore, if a plurality of variable gain amplifier cells are series-connected, there is a benefit in which the bias does not need to be applied separately.

Voltage Vn for regulating the bias current of the variable gain amplifier cell enables a constant current in the transistor M5 to flow even if the bias states of the input differential transistors M1, M2 according to the control voltage Vcon are caused to change to vary the potential of node D. Such a constant bias current is to prevent the frequency characteristics from degrading at high frequency.

If the amplifier is applied with a large input, the low external control voltage Vc to reduce the amplification gain is applied to the input of the control voltage generator 200, which regulates the outputted control voltage Vcon of the variable gain amplifier cell to be low.

If the control voltage Vcon becomes low, the drain voltages of the input differential transistors M1, M2 become low to enter the linear region, resulting in improved distortion characteristics while the gain is reduced. In other words, when the input is large, if the control voltage Vc is regulated externally to reduce the control voltage Vcon of variable gain amplifier cell, the operating points of the input differential transistors M1, M2 are forced to be in linear region to widen the operation range with small distortion.

Conversely, if the amplifier has a small applied input, an external high control voltage Vc to increase the amplification gain is applied to the input of the control voltage generator 200, and, the outputted control voltage Vcon of the variable gain amplifier cell is regulated to be high. If the control voltage Vcon becomes high, then the operating points of the input differential transistors M1, M2 are in the saturation region, In this case, the acceptable distortion range becomes narrow, but the signal distortion is small due to the small input.

At this time, the generation of the external control voltage Vc is set depending on the characteristics of the applied systems.

As a result, the features of the variable gain amplifier cell according to the disclosed embodiment of the present invention are that the degradation of the variable gain characteristics at high frequency is minimized, and the distortion characteristics are improved by suitably operating the input differential transistors M1, M2 between the saturation region and the linear region according to the magnitude of the input voltage.

The operation of the control voltage generator 200 for generating the control voltage of the variable gain amplifier cell will be described in detail below.

The exponential function voltage generator 210 has an output that generates an inverse-exponential function voltage Voe according to the external control voltage Vc, and the voltage Voe is applied to the input of the variable gain amplifier cell 220. The variable gain amplifier cell 220 has the output node that outputs the voltage according to the voltage Voe, and a current in the output node flows in the direction of offsetting the output voltage with the output node being connected to the constant current source 230. Therefore, the operational amplifier 240 is supplied with the voltage Vov to be offset by the current source 230.

Also, the output of the operational amplifier 240 becomes the control voltage Vcon of the variable gain amplifier cell 220. The control voltage Vcon regulates the gain of the variable gain amplifier cell 220 to make the input voltage Vov of the operational amplifier 240 to be nearly 0 volt (which is a normal state input of an operational amplifier and is substantially a very small value). In other words, the gain of the variable gain amplifier cell 220 takes the form of the exponential function.

The above is illustrated using the following formula in detail. For the given input voltage Vc, the output voltage Voe of the exponential function voltage generator 210 is expressed as the following formula 1:
[Formula 1]

$$V_{oe} = K_1 \cdot \text{EXP}(-K_2 \cdot V_c)$$

where, $K_1$ and $K_2$ are constants according to the circuit.

Assuming that the gain of the variable gain amplifier cell 220 is defined as Av, its output voltage as Vov, and the magnitude of the voltage offset by connecting the output node to the current source 230 as $V_k$, the relationship among them is represented as follows.
[Formula 2]

$$V_{ov} = V_{oe} \cdot A_v - V_k = K_1 \cdot \text{EXP}(-K_2 \cdot V_c) \cdot A_v - V_k$$

However, since the control voltage Vcon of the variable gain amplifier cell 220 is generated to make the input voltage Vov of the operational amplifier 240 to be 0 in the normal state, the output voltage of the variable gain amplifier cell 220 itself is actually fixed as a constant $V_k$.

In other words, the input voltage Vov of the operational amplifier 240 becomes 0, and this is represented as the following formula 3.
[Formula 3]

$$K_1 \cdot \text{EXP}(-K_2 \cdot V_C) \cdot A_{V=VK}$$

From the formula 3, Av is represented as the following formula 4.
[Formula 4]

$$A_v = V_k \cdot K_1^{-1} \cdot \text{EXP}(K_2 \cdot V_c)$$

It will be apparent from the formula 4 that the gain of the variable gain amplifier cell 220 is in the form of the exponential function to the input control voltage Vc. Meanwhile, because the amplifier 100 comprises the same three variable gain amplifier cells 110–130 connected in series, the total gain of the amplifier 100 is given as the formula 5.
[Formula 5]

$$A_v(_{total}) = [V_k \cdot K_1^{-1} \cdot \text{EXP}(K_2 \cdot V_c)]^3$$

$$= (V_k \cdot K_1^{-1})^3 \cdot \text{EXP}(3K_2 \cdot V_c)$$

Also, it will be apparent from the formula 5 that the total gain is in the form of the exponential function to the input control voltage Vc.

Figure 5:
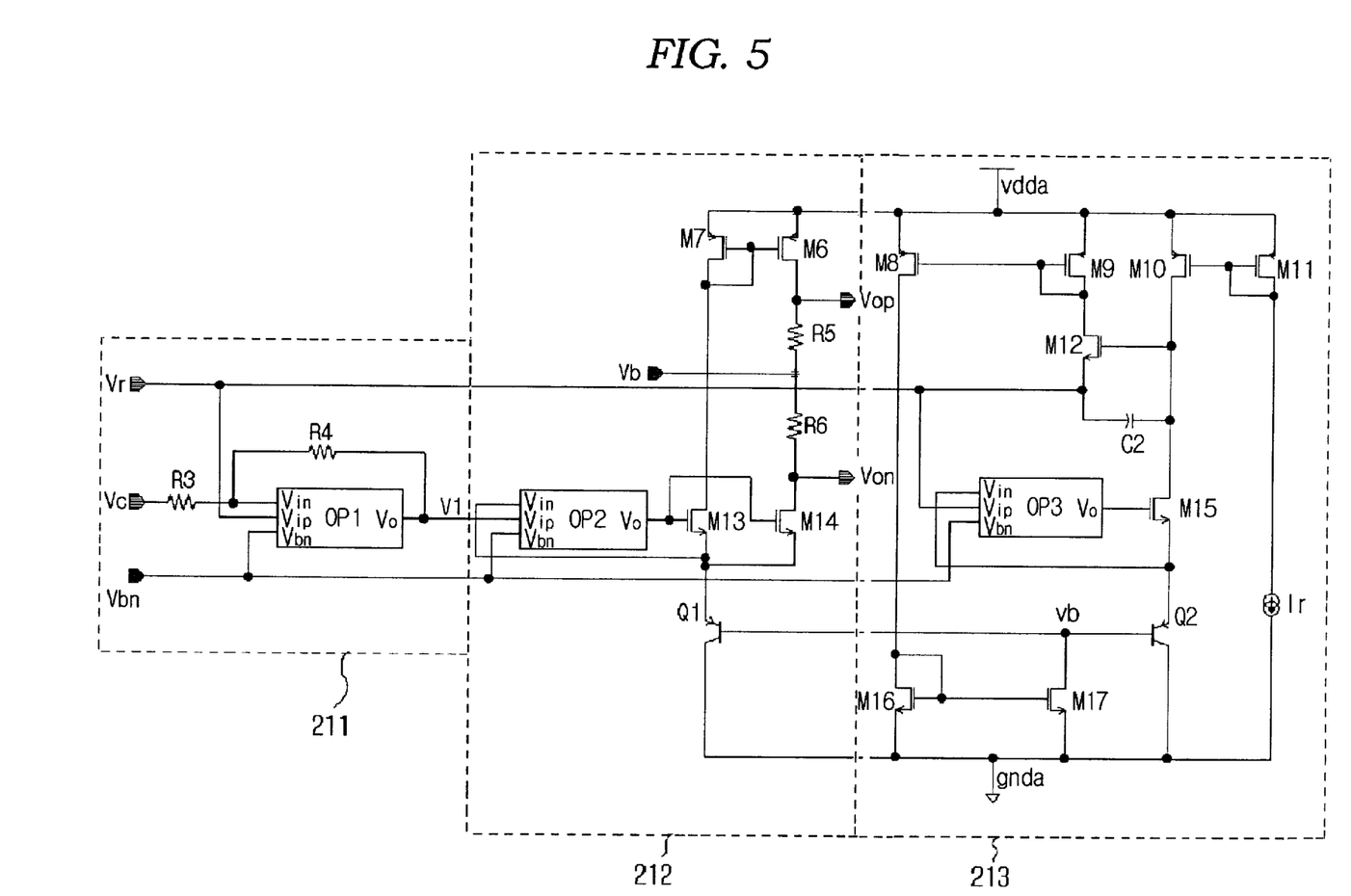
FIG. 5 is a detailed circuit diagram of an exponential function voltage generator used in the present invention.

Now, the exponential function voltage generator 210 of FIG. 5 is described in detail. As shown in FIG. 5, the exponential function voltage generator 210 according to the present invention comprises a control voltage converter 211 for converting the external control voltage Vc into a magnitude suitable for the internal signal processing, an exponential function voltage generator 212 for generating the exponential function voltage with the emitter of the internal bipolar transistor being supplied with the output of the control voltage converter 211, and a base voltage generator 213 for providing the base voltage of the bipolar transistor of the exponential function voltage generator 212. Also, the control voltage converter 211 comprises an operational amplifier OP1 in which the magnitude of the output voltage V1 is regulated by resistors R3 and R4.

The exponential function voltage generator 212 comprises an operational amplifier OP2 and transistors M13 and M14 for forming the voltage-follower to the output voltage of the control voltage converter 211; a bipolar transistor Q1 of which the emitter is applied with the source voltage of the transistors M13 and M14 and the base is applied with the voltage from the base voltage generator 213 for generating an exponential function current to the emitter thereof; transistors M6 and M7 for forming a current mirror to the drain current of the transistor M13; and resistors RS and R6 for converting the sourcing current flowing through the drain of the transistor M6 and the sinking current flowing through the drain of the transistor M14 into the voltage in the form of exponential function, respectively. The base voltage generator 213 comprises an operational amplifier OP3 and a transistor M15 for forming the voltage-follower to the external reference voltage; a bipolar transistor Q2 of which the emitter is applied with the source voltage of the transistor M15 for generating the base current of the bipolar transistor of said exponential function voltage generator 212; a transistor M11 for receiving a certain drain current from the said current source 230; a transistor M10 for forming a current mirror to said transistor M11; and transistors M12, M9, M8, M16 and M17 for forming an operational amplifier having the gate and the source terminals of the transistor M12 as two input terminals and regulating the base voltage of said bipolar transistor Q2 according to the variation of the drain current of said transistor M10.

The basic principle of the thus formed exponential function voltage generator 210 is based on the phenomenon that if the voltage is applied between the emitter and the base of a bipolar transistor, the resulting current is in the form of an exponential function. Namely, the relationship between the output current and the emitter-base voltage in a bipolar transistor is as follows.

[Formula 6]

$$I_E = I_S \cdot EXP(V_{BE}/V_T)$$

where, $I_E$ is the emitter current, $I_S$ is the saturation current, $V_{BE}$ is the base-emitter voltage, and $V_T$ is the threshold voltage. First, the range of the input control voltage which is applied externally should be regulated to be suitable for the internal voltage. The operational amplifier OP1 of the control voltage converter 211 is formed as an inverter type and regulates the magnitudes of the resistors R3, R4 for regulating the magnitude of the output voltage V1 while changing the polarity of the voltage. At this time, Vip terminal of the operational amplifier OP1 is connected to a constant voltage Vr, and therefore the average DC level of the output of the operational amplifier OP1 is set to the constant voltage Vr. The output voltage VI of the operational amplifier OP1 is applied to the gates of the transistors M13 and M14 through the operational amplifier OP2, and the source voltages of the transistors M13, M14 are negative feedbacked to the operational amplifier OP2, resulting in the voltage of the magnitude V1 being applied to the emitter of the bipolar transistor Q1. By the same principle, the voltage Vr is applied to the emitter of the bipolar transistor Q2. The bias current of the bipolar transistor Q2 depends on Ir because the constant Ir from the external current source flows into the drain of the transistor M11 which is diode connected and the same magnitude Ir flows into the drain of transistor M10 based on the fact that transistors M10 and M11 are in the form of a current mirror.

If the current smaller than Ir flows in the emitter of the bipolar transistor Q2, the gate voltage of the transistor M12 becomes high. Due to this, the drain current of the transistor M12 flows through the transistors M9, M8, M16, and M17 and reduces the base voltage Vb of the bipolar transistors Q1, Q2, thereby cause the flow of current Ir in the emitter of the bipolar transistor Q2. The magnitude of the current Ir determines the current of the bipolar transistor Q1 when the magnitude of the external control voltage Vc is the same as that of Vr.

According to the variation of the control voltage Vc, the output voltage V1 of the control voltage converter 211 varies, and due to this variation the emitter voltage of the bipolar transistor Q1 varies, so that the exponential function current flows in the emitter of the transistor Q1.

The magnitude of the current flowing in the bipolar transistor Q1 is double that of the bipolar transistor Q2, and therefore, when V1=Vr, the current of 2*Ir flows in the transistor Q1. Accordingly, the current Ir flows in each of the transistors M13 and M14. The drain current of the transistor M13 has the sourcing current flow in the drain of transistor M6 through the current mirrors of the transistors M6 and M7, and the drain current of transistor M14 has the sinking current of the same magnitude flow in the drain of transistor M6 through the current mirrors of the transistors M6 and M7. The each of these two currents is connected to the constant voltage Vb through the resistors R5 and R6. Because the two currents are in the form of an exponential function, the output voltages Vop and Von are also in the form of an exponential function.

As illustrated in the above, the disclosed embodiment of present invention makes it possible to manufacture a variable gain amplifier for the intermediate frequency having wide variable gain characteristics up to the maximum operating frequency of a CMOS element. Also, the variable gain amplifier of the present invention using CMOS elements has the advantage that the manufacturing cost of mobile communication chips is reduced and the mobile communication devices can be compact.

Although the preferred embodiments of the present invention have been described and shown with reference to the drawings for illustrative purposes, the ordinary persons skilled in the art will appreciate that various modifications, additions and substitutions are possible, without departing from the scope and spirit of the invention as set forth in the accompanying claims and the equivalents thereof.

What is claimed is:

1. A CMOS variable gain amplifier comprising:
an amplifier having a plurality of variable gain amplifier cells with substantially the same gains connected in series to continuously have a broad gain variation; and
a control voltage generator for generating a control voltage of the variable gain amplifier cells to vary a gain of the amplifier by an external control voltage which is regulated according to input voltages and outputting the control voltage, wherein the control voltage generator comprises:

an exponential function voltage generator for generating a voltage in the form of an exponential function according to a control input voltage, a variable gain amplifier cell for amplifying an output voltage of the exponential function voltage generator;

a current source connected to an output node of the cariable gain amplifier cell for providing a current in the direction of offsetting an output voltage of the variable gain amplifier cell, and an operational amplifier for receiving the offset voltage by the current source and generating the control voltage of the variable gain amplifier cells.

2. The CMOS variable gain amplifier of claim 1, wherein each variable gain amplifier cells of the amplifier comprise:

an input differential amplifier including a first and a second input differential transistor having voltage inputs;

a bias current source including a first transistor of which a drain is commonly connected to sources of the first and the second input differential transistors for supplying a bias current;

an operating point controller including a second and a third transistor of which each source is connected to the drains of the first and the second input differential transistors and a common gate is connected to a control voltage terminal for controlling the operating point to be in a linear region and a saturation region of the first and the second input differential transistors; and load resistors respectively connected to drains of the second and the third transistors for loading output voltages at a connection point.

3. The CMOS variable gain amplifier of claim 1, wherein the exponential function voltage generator comprises:

a control voltage converter for converting the external control voltage to a magnitude suitable for an internal signal processing;

an exponential function voltage generator for generating an exponential function voltage with an emitter of an internal bipolar element being supplied with an output of the control voltage converter; and a base voltage generator for determining a base voltage of the bipolar element of the exponential function voltage generator.

4. The CMOS variable gain amplifier of claim 3, wherein the control voltage converter comprises an operational amplifier in which the magnitude of the output voltage is regulated by resistors.

5. The CMOS variable gain amplifier of claim 3, wherein the exponential function voltage generator comprises:

an operational amplifier and a fourth transistor and a fifth transistor for forming a voltage-follower to an output voltage of the control voltage converter;

a bipolar transistor of which an emitter is applied with source voltages of the fourth and the fifth transistors and a base is applied with a voltage from the base voltage generator for generating an exponential function current to the emitter thereof;

a sixth transistor and a seventh transistor for forming a current mirror to a drain current of the fourth transistor; and resistors for converting a sourcing current flowing through a drain of the sixth transistor and a sinking current flowing through a drain of the fifth transistor into a voltage in the form of an exponential function, respectively.

6. The CMOS variable gain amplifier of claim 3, wherein the base voltage generator comprises:

an operational amplifier and an eighth transistor for forming a voltage-follower to an external reference voltage;

a bipolar transistor of which an emitter is applied with a source voltage of the eighth transistor for generating an emitter current of the bipolar transistor of the exponential function voltage generator;

a ninth transistor for receiving a certain drain current from the current source;

a tenth transistor coupled to the ninth transistor to form a current mirror; and an eleventh transistor, a twelfth transistor, a thirteenth transistor, a fourteenth transistor and a fifteenth transistor coupled together to form an operational amplifier having a gate terminal and a source terminal of the eleventh transistor as two input terminals and regulating the base voltage of the bipolar transistor according to a drain current variation of the tenth transistor.

7. The CMOS variable gain amplifier of claim 1, wherein operating points of CMOS elements of the variable gain amplifier cells are controlled to be in a linear region or a saturation region by a control voltage that is externally regulated according to an input voltage to continuously vary the operating points.

* * * * *